(12) United States Patent
Julicher

(10) Patent No.: US 6,439,010 B1
(45) Date of Patent: Aug. 27, 2002

(54) RING-TYPE METER LOCK

(75) Inventor: Bradley J. Julicher, Orchard Park, NY (US)

(73) Assignee: McGard, Inc., Orchard Park, NY (US)

( * ) Notice: Subject to any disclaimer, the term of this patent is extended or adjusted under 35 U.S.C. 154(b) by 0 days.

(21) Appl. No.: 09/566,292

(22) Filed: May 5, 2000

(51) Int. Cl.[7] ............................................. G01R 11/04
(52) U.S. Cl. ......................... 70/164; 70/232; 292/256.6
(58) Field of Search ......................... 70/164, 232, 165, 70/158, 166, 167, 259, 260; 292/256.6, 265.5, 258, 327, 302

(56) References Cited

U.S. PATENT DOCUMENTS

| | | | |
|---|---|---|---|
| 3,867,822 A | 2/1975 | Morse et al. ................. | 70/164 |
| 4,149,741 A | 4/1979 | Lipscomb et al. ........ | 292/256.6 |
| 4,226,102 A | 10/1980 | Mattress, Jr. ................ | 70/164 |
| 4,331,012 A | 5/1982 | Swisher ....................... | 70/164 |
| 4,415,190 A | 11/1983 | Finck, Jr. et al. ........ | 292/256.6 |
| 4,457,445 A | 7/1984 | Hanks et al. ................ | 220/214 |
| 4,611,478 A | 9/1986 | Carlson et al. ............... | 70/164 |
| 4,702,093 A | 10/1987 | DeWalch ..................... | 70/164 |
| 4,828,300 A | 5/1989 | Agbay ..................... | 292/256.6 |
| 5,048,881 A | 9/1991 | Renfro ....................... | 292/320 |
| 5,121,953 A | 6/1992 | Mahaney ................. | 292/256.6 |
| 5,388,436 A | 2/1995 | Shieh .......................... | 70/226 |
| 5,442,941 A | 8/1995 | Kahonen et al. .............. | 70/34 |
| 5,542,722 A | 8/1996 | DeWalch ................. | 292/256.6 |

*Primary Examiner*—William A. Cuchlinski, Jr.
*Assistant Examiner*—Arthur D. Donnelly
(74) *Attorney, Agent, or Firm*—Joseph P. Gastel

(57) ABSTRACT

A ring-type meter lock including a resilient ring, first and second ends on the ring, a lock housing on the first end, a first slot in the lock housing, a latch unit in a threaded bore in the lock housing, the latch unit consisting of a threaded plug and a stem slidably mounting a latch with a spring between the plug and the latch which biases the latch into the first slot, an apertured tongue on the second end of the ring enterable into the first slot, at least one second slot in the tongue for receiving the spring-biased latch, and a key-receiving configuration on the threaded plug.

32 Claims, 7 Drawing Sheets

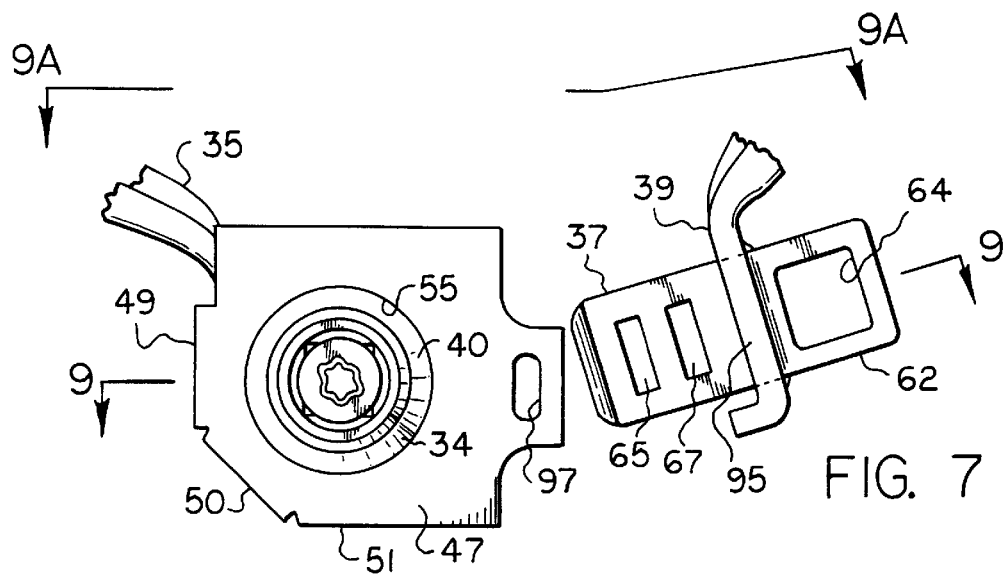
FIG. 7
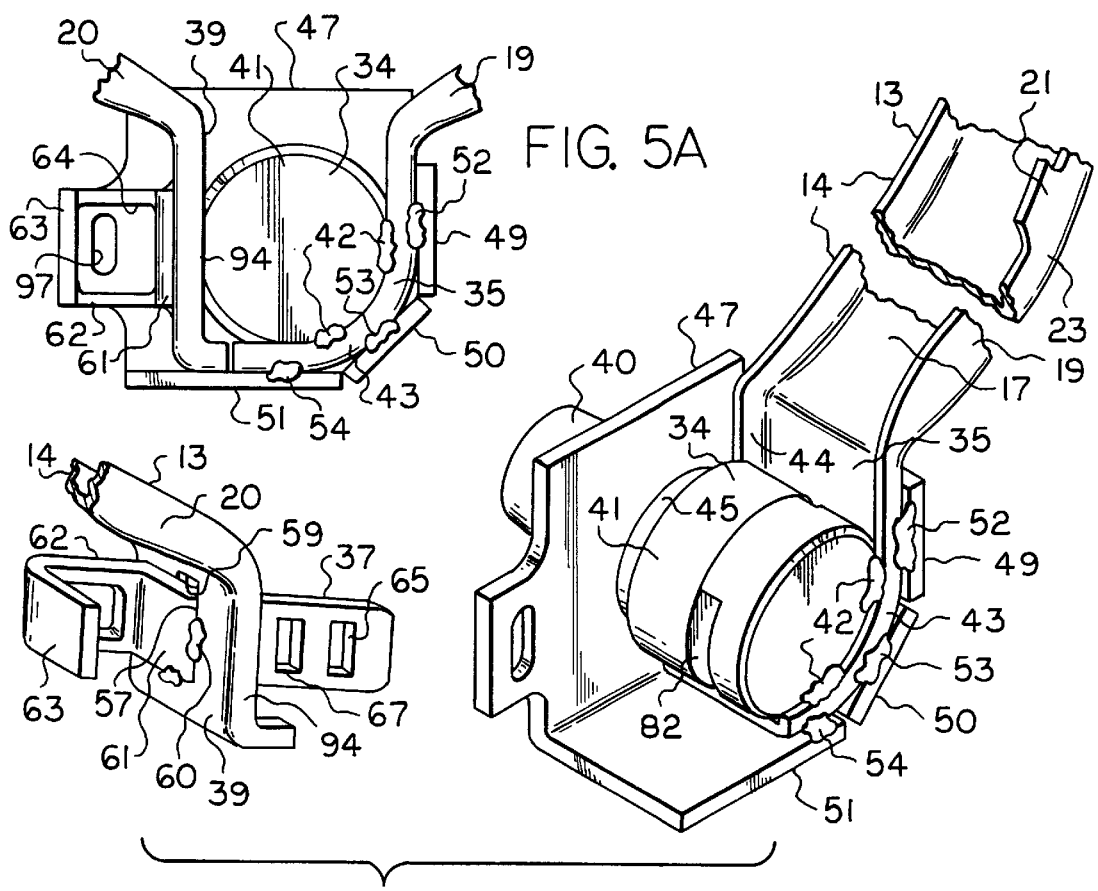
FIG. 5A
FIG. 8

RING-TYPE METER LOCK

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to an improved ring-type meter lock.

By way of background, there are numerous types of ring-type meter locks in existence. However, many of these types are relatively complex, or require a key to both lock and unlock them or cannot utilize different key-receiving configurations.

BRIEF SUMMARY OF THE INVENTION

It is one object of the present invention to provide a ring-type meter lock which is relatively simple in construction.

Another object of the present invention is to provide an improved ring-type meter lock which can be placed in a locked condition without the use of a key.

A further object of the present invention is to provide an improved ring-type meter lock in which the key-receiving configuration can be changed in a simple and expedient manner.

Another object of the present invention is to provide an improved ring-type meter lock which is of a construction wherein the key-receiving configuration, although removable, is maintained in position by an interference fit which, in turn, requires a relatively high torque to move it to an unlocked position, thereby enhancing the security against unauthorized unlocking. Other objects and attendant advantages of the present invention will readily be perceived hereafter.

The present invention relates to a ring-type meter lock comprising a ring, first and second ends on said ring, a lock housing on said first end, a slot in said lock housing, a latch unit in said lock housing, a latch on said latch unit enterable and withdrawable from said slot, an apertured tongue on said second end enterable into said slot, at least one slot in said tongue receiving said latch, and a key-receiving configuration in said latch unit.

The various aspects of the present invention will be more fully understood when the following portions of the specification are read in conjunction with the accompanying drawings wherein:

BRIEF DESCRIPTION OF THE SEVERAL VIEWS OF THE DRAWING

FIG. 5A is a fragmentary rear view of the ring-type meter lock in a locked condition taken substantially in the direction of arrows 5A—5A of FIG. 3;

FIG. 7 is an enlarged fragmentary front elevational view showing the lock components of the ring-type meter lock in an unlocked condition;

FIG. 8 is a fragmentary perspective view of the rear of the lock structure of the ring-type meter lock in an unlocked condition;

DETAILED DESCRIPTION OF THE INVENTION

Figure 1:
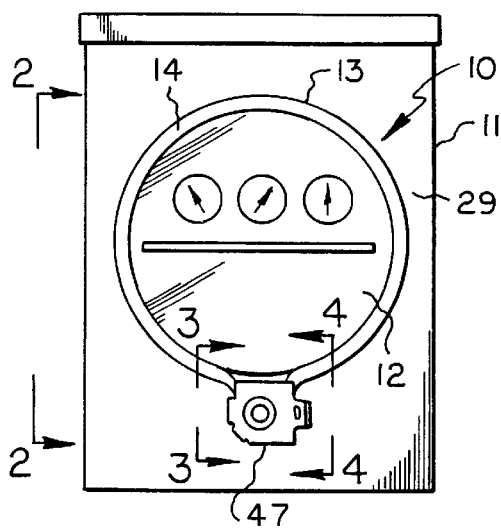
FIG. 1 is a front elevational view of an electric meter mounting the improved ring-type meter lock thereon.
Figure 2:
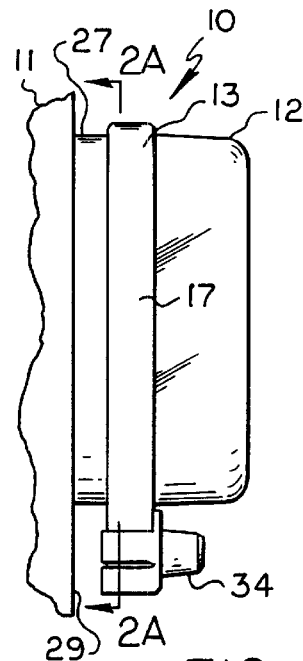
FIG. 2 is a fragmentary side elevational view taken substantially in the direction of arrows 2—2 of FIG. 1.
Figure 3:
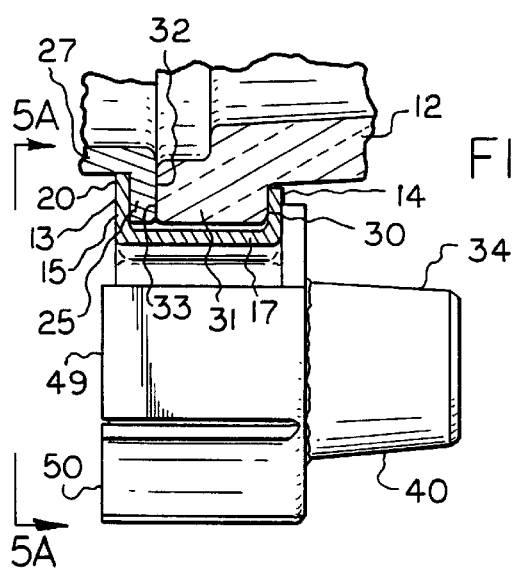
FIG. 3 is a fragmentary cross sectional view taken substantially along line 3—3 of FIG. 1.
Figure 2A:
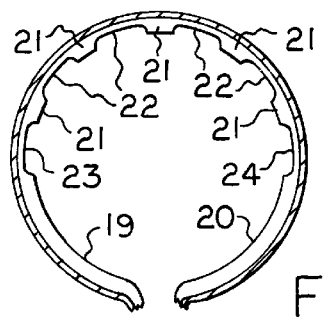
FIG. 2A is a reduced fragmentary cross sectional view of the side of the ring taken substantially along line 2A—2A of FIG. 2.
Figure 4:
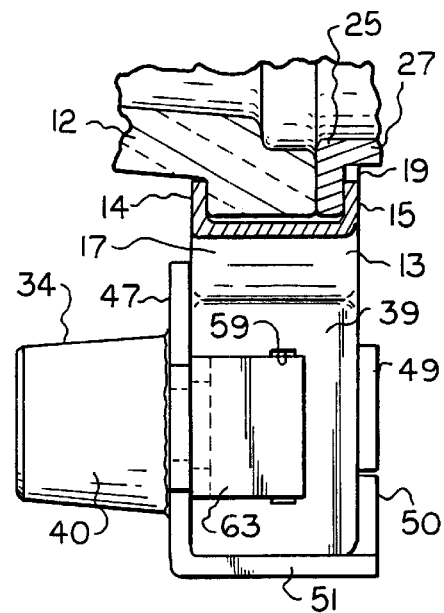
FIG. 4 is a fragmentary cross sectional view taken substantially along line 4—4 of FIG. 1.
Figure 5:
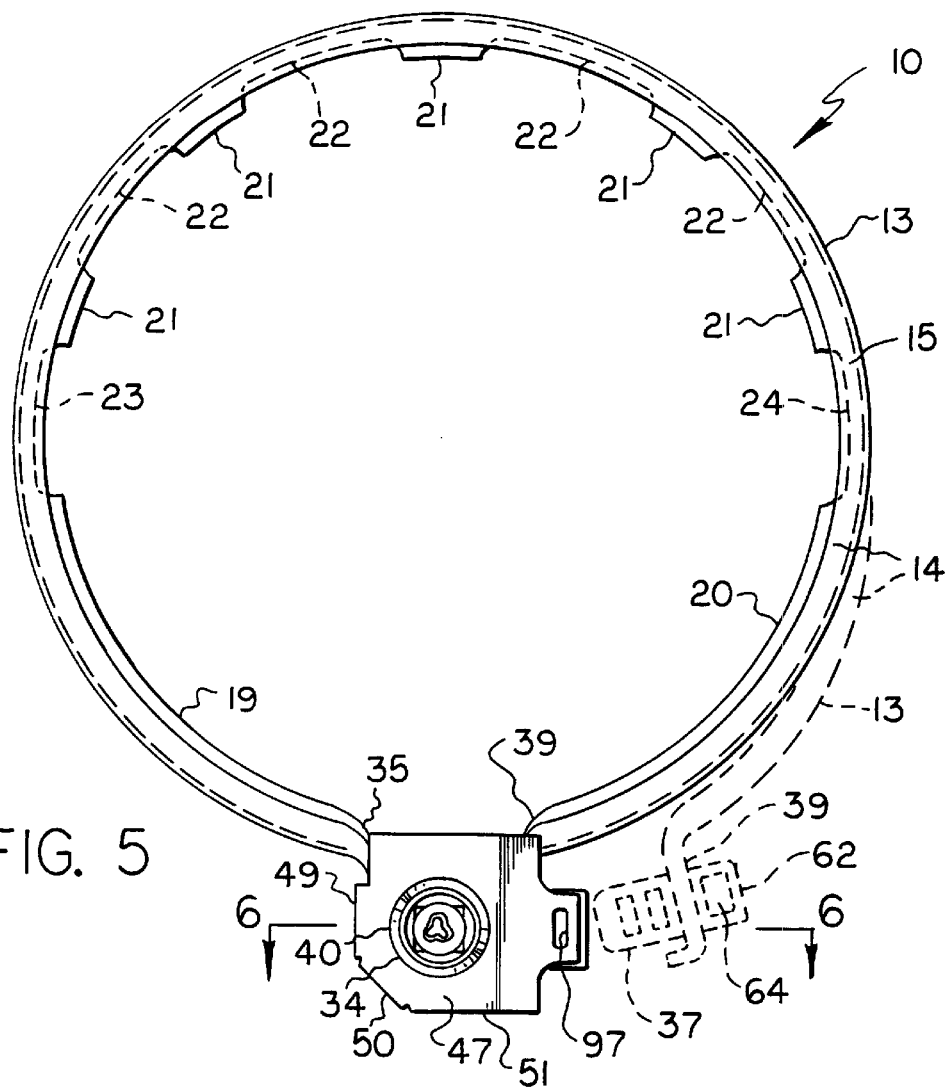
FIG. 5 is a plan view of the ring-type meter lock in a locked condition in solid lines and in unlocked condition in dotted lines.

The improved ring-type meter lock 10 (FIG. 5) is shown in FIGS. 1–4 as being mounted on a meter 11 having a transparent globe 12 removably secured thereto by meter lock 10.

The ring-type meter lock 10 (FIG. 5) includes a curvilinear resilient channel-like ring 13 having a leg or side 14 of substantially uniform width throughout its circumference and a leg 15 connected to leg 14 by web 17. Leg 15 includes two large curvilinear portions 19 and 20 and a plurality of spaced shorter circumferential portions 21 with shorter side portions 22 therebetween. A shorter side portion 23 separates side portions 19 and 21 and a shorter side portion 24 separates side portions 20 and 21.

In a locked condition (FIGS. 3 and 4) side portions 19, 20, 21, 22, 23 and 24 engage flange 25 at the outer end of annular portion 27 (FIGS. 2–4) which extends outwardly from the face 29 of meter 11. Leg or side 14 engages side 30 of annular rim 31 of globe 12, and side 32 of flange 25 bears against side 33 of globe rim 31.

A lock housing 34 is mounted on end 35 of resilient ring 13, and a tongue 37 is mounted on the opposite end 39 of resilient ring 13 (FIG. 8). The lock housing 34 includes a front portion 40 and a rear portion 41. The rear portion 41 of housing 34 (FIGS. 5A and 8) is welded to end 35 of ring 13 at 42 on flange 43, and flange 44 of end portion 35 is received in annular groove 45 which is located between front housing portion 40 and rear housing portion 41. A front plate 47 includes flanges 49, 50 and 51 which extend perpendicularly thereto, and the outer ends of flanges 49, 50 and 51 are welded to flange 43 of end portion 35 at 52, 53 and 54, respectively. The front plate 47 includes a circular cutout 55 (FIGS. 6, 7, 9 and 10) into which the front portion 40 of housing 34 fits.

The tongue 37 is mounted on end 39 of ring 13 in the following manner. A portion 57 (FIGS. 6, 8 and 9) of tongue 37 fits through a slot 59 in ring end 39 and is welded thereto at 60. Tongue 37 also includes a substantially perpendicular portion 61 which extends across the rear of ring end 39, and it includes a portion 62 which extends substantially parallel to latch 37 and a portion 63 which is substantially parallel to portion 61. An aperture 64 is located in latch portion 62. Tongue 37 also includes two slots 65 and 67.

Figure 11:
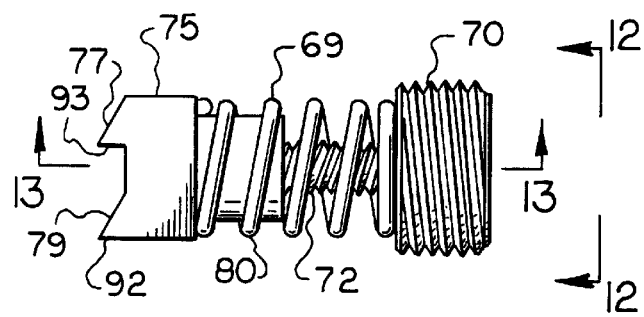
FIG. 11 is a plan view of the latch unit.
Figure 13:
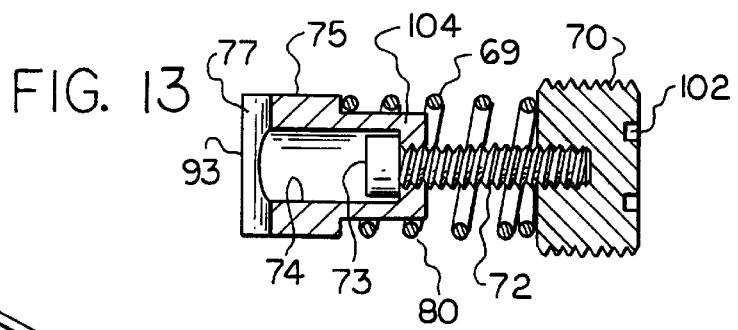
FIG. 13 is a cross sectional view of the latch unit taken substantially along line 13—13 of FIG. 11.

A plunger-type latch unit 69 (FIGS. 9, 11 and 13) is movably positioned in housing 40. Latch unit 69 includes a threaded plug 70 which is threaded into tapered tapped bore 71 of housing 40. The tapered threaded bore provides security against the unauthorized removal of plug 70 because the threaded connection between the plug 70 and the tapered bore 71 creates an interference fit which requires a large torque to undo. A stem 72 is threaded into plug 70 and the head 73 (FIG. 13) of stem 72 is slidably received in bore 74 of latch head 75 which has ratchet teeth 77 and 79 thereon. A coil spring 80 biases plug 70 and latch head 75 apart (FIG. 13). Latch head 75 (FIG. 10) is of substantially square cross sectional configuration, and it is slidably secured within substantially square bore 81. As can be seen from FIG. 9, the portion 71 of bore in housing 40 is threaded and the portion 81 of the bore is substantially square. Thus, when the latch unit is inserted into the bore, the plug 71 will reach its limit of inward movement when it reaches the unthreaded portion 81. At this time the latch unit will occupy the position shown in FIG. 9 because of the manner in which the various parts are proportioned, and the head 73 of stem 72 will be in the position shown in FIG. 13. It will be appreciated that the latch head 75 and bore 81 can be of any noncircular shape as long as ratchet teeth 77 and 79 will be maintained in the proper orientation to be received in tongue slots 67 and 65, respectively.

Figure 9:
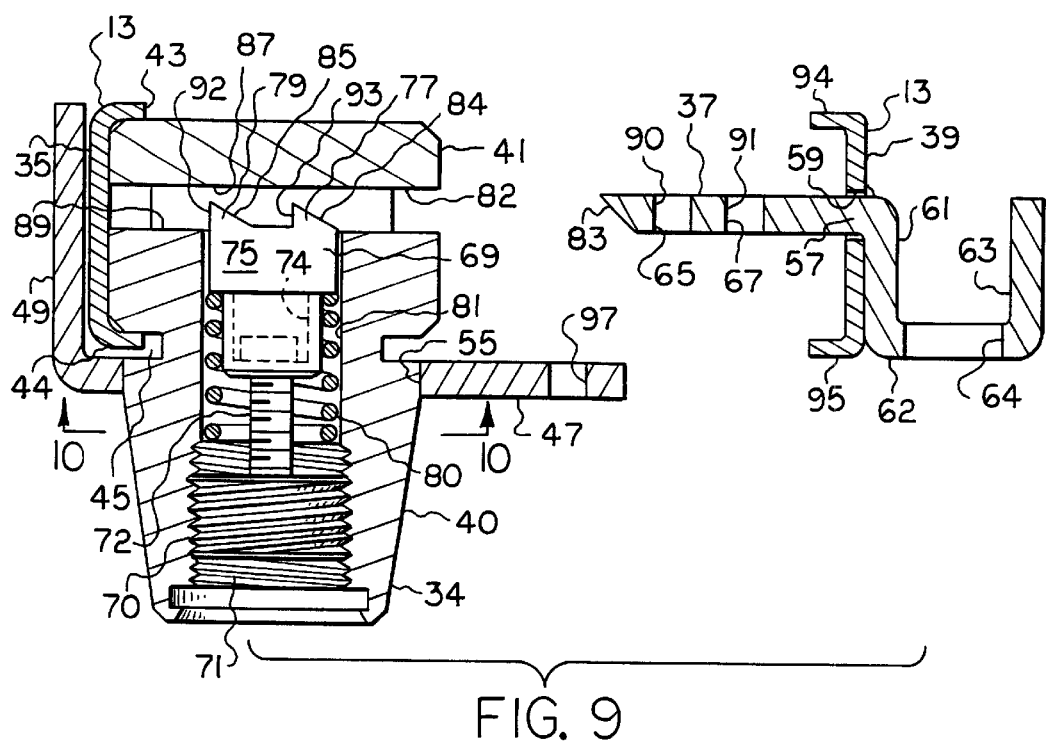
FIG. 9 is an enlarged cross sectional view taken substantially along line 9—9 of FIG. 7.
Figure 9A:
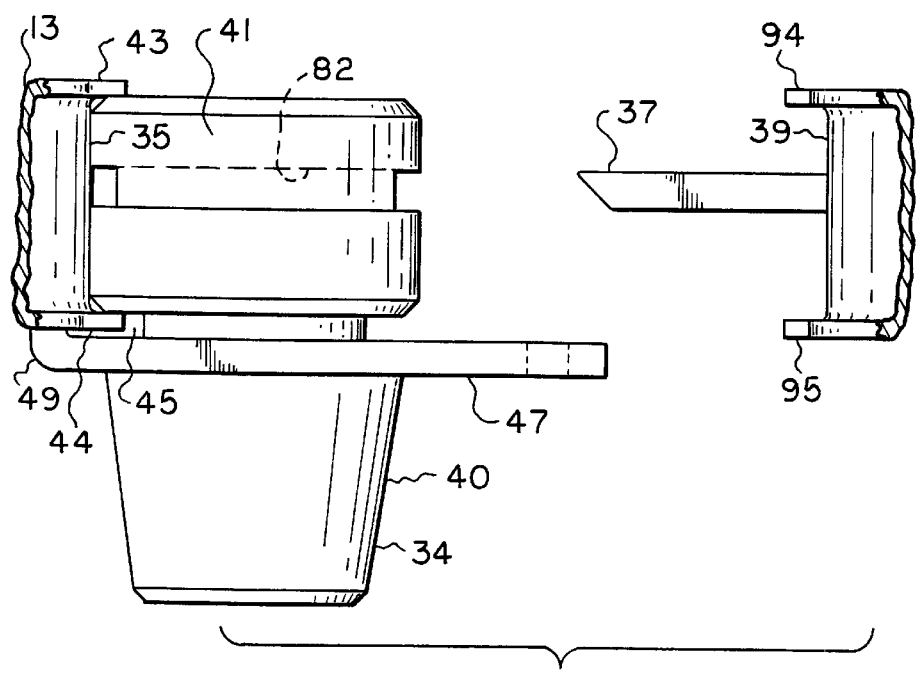
FIG. 9A is a view of the lock structure taken substantially in the direction of arrows 9A—9A of FIG. 7.
Figure 10:
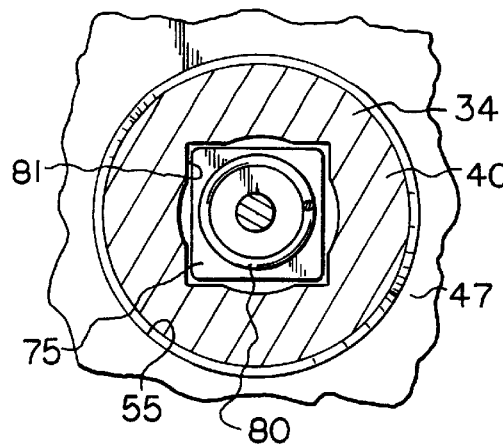
FIG. 10 is a fragmentary cross sectional view of the lock structure taken substantially along line 10—10 of FIG. 9 with parts omitted.
Figure 15:
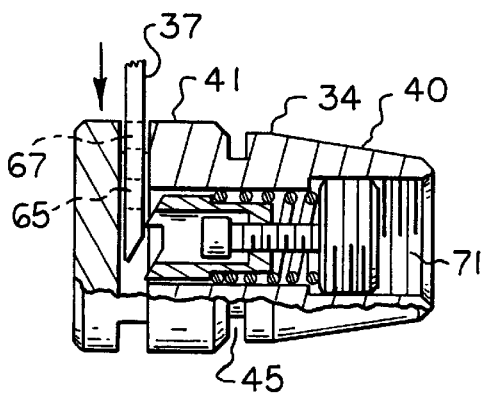
FIG. 15 is a cross sectional view similar to FIG. 14 but showing the tongue entering the housing.

The ring 13 can be placed in a locked condition without the use of a key. As noted above, ring 13 is resilient, and when it is in an unlocked condition, the end carrying the tongue 37 will be biased to the dotted line position of FIG. 5. Thus, the ring 13 will be expanded so that it can be mounted about the meter flange 25 and globe rim 31 as described above relative to FIGS. 3 and 4. Thereafter, the end of ring 13 carrying tab 37 is moved from its dotted line position in FIG. 5 to its solid line position against the resilience of the ring so that tongue 37 will enter slot 82 (FIGS. 8, 9, 9A) of housing portion 41. The beveled tip 83 (FIG. 9) of tongue 37 will ride along the inclined faces 84 and 85 of teeth 77 and 79, respectively, as tongue 37 is guided between walls 87 and 89 of slot 82. As the tongue 37 moves against teeth 77 and 79, the latch head 75 will move inwardly into square bore portion 81 against the bias of spring 80. This position is depicted in FIG. 15. When the tongue reaches a position wherein slots 65 and 67 therein are abreast of teeth 77 and 79, respectively, spring 80 will bias latch head 75 from its retracted position of FIG. 15 into slots 65 and 67 of tongue 37. In the locked position, the tongue 37 cannot be withdrawn because the sides 90 and 91 (FIG. 9) of tongue slots 65 and 67, respectively, will be in abutting relationship with sides 92 and 93, respectively, of teeth 79 and 77, respectively.

Figure 6:
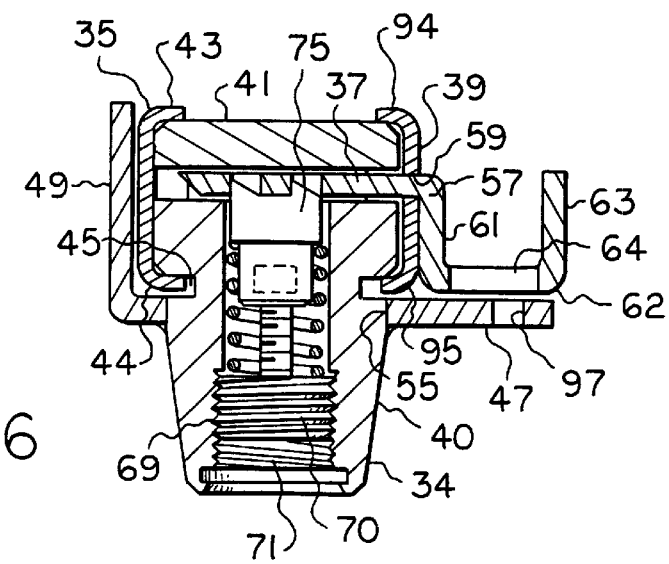
FIG. 6 is an enlarged cross sectional view taken substantially along line 6—6 of the solid lines of FIG. 5.

When tongue 37 is in the above-described locked position with teeth 77 and 79, flanges 94 and 95 (FIG. 9) of ring end 39 will occupy the positions shown in FIG. 6 wherein flange 95 is received within annular groove 45 and flange 94 is located at the rear of rear housing portion 41 in opposition to flange 43 of ring end 35. At this time opening 64 in tongue portion 62 will be aligned with slot 97 of front plate 47 so that a wire-type of locking seal can be placed through slot 97 and opening 64 to prevent unlatching of the lock without destroying the seal.

At this point it is to be noted that the latch may be engaged with only tooth 77 being received within slot 65 of tongue 37. In this event also there will be an alignment of slot 97 in face plate 47 with opening 64 of tooth portion 62 for receiving a wire-type of seal. It will be appreciated that when the foregoing single tooth locking relationship is effected, the diameter of ring 13 will be slightly larger in its locked position than when both teeth 77 and 79 are positioned in tongue slot 67 and 65, respectively. Therefore, the ring can fit onto a slightly larger annular rim 31 of a globe than when both teeth of the latch head are in slots 65 and 67.

Figure 12:
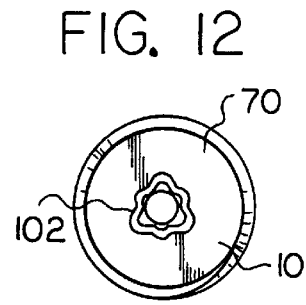
FIG. 12 is an end view of the latch unit taken substantially in the direction of arrows 12—12 of FIG. 11.
Figure 14:
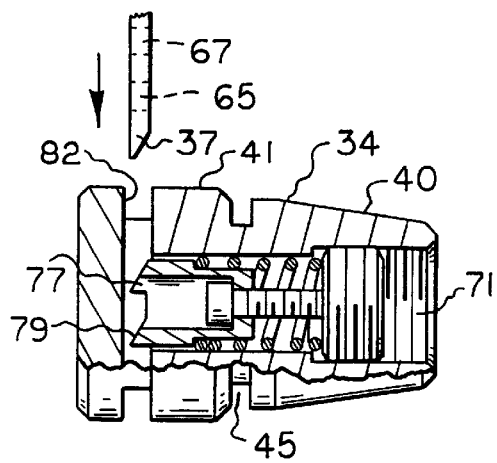
FIG. 14 is a cross sectional view similar to FIG. 9 showing the latch unit and tongue in an open condition.
Figure 16:
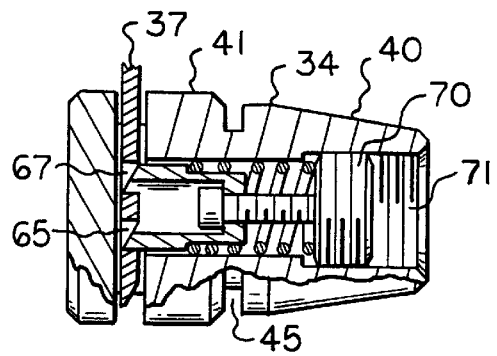
FIG. 16 is a cross sectional view similar to FIG. 15 and showing the tongue in a locked condition.
Figure 17:
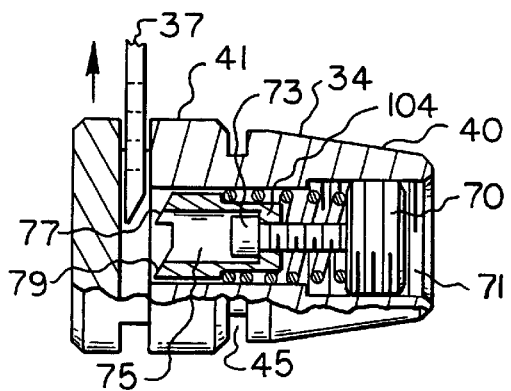
FIG. 17 is a view similar to FIG. 16 but showing the latch in a retracted condition and the tongue released therefrom.

The ring-type meter lock 10 is unlocked to its position of FIG. 17 from its locked position of FIG. 16 by utilizing a key 99 having a curvilinear ridge 100 (FIG. 18) at the end of stem 101. Curvilinear ridge 100 is of a configuration to mate with curvilinear groove 102 (FIGS. 12 and 13) in the face 103 of threaded plug 70. When threaded plug 70 is threaded outwardly in threaded bore 71 from the position of FIG. 16 to the position of FIG. 17, the head 73 (FIG. 13) of stem 72 will bear against end wall 104 (FIG. 13) to pull latch head 75 into substantially square bore 81 to the position shown in FIG. 17 wherein the natural resilience of ring 13 will cause tongue 37 to be withdrawn from housing 34 to the position shown in dotted lines in FIG. 5, and when the ring 13 is in the dotted line position of FIG. 5, it can be removed from engagement with the globe and the meter so that the globe 12 can be removed from its mounted position. In order to reset the latch unit to receive tongue 37 in a locked condition, the plug 70 is threaded back from its position of FIG. 17 to its position of FIG. 14 whereupon latching engagement will be effected between tongue 37 and one or more teeth 77 and 79 in the manner described above when tongue 37 is inserted into slot 82. The latch unit 69 can be replaced easily because of the fact that it can be removed from its bore by merely unscrewing it completely, rather than partially as in FIG. 17. This provides the option of replacing the entire latch unit with a plug having a different key-receiving configuration. Also, if desired, the plug 70 itself can be unscrewed from stem 72 and replaced with a plug having a different key-receiving configuration.

Figure 19:
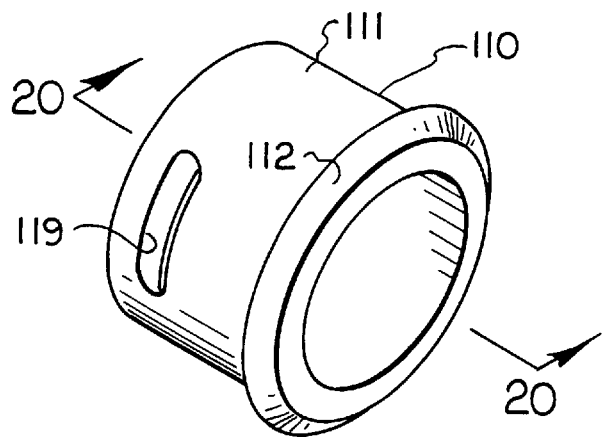
FIG. 19 is a perspective view of a ring-lock key guide.
Figure 20:
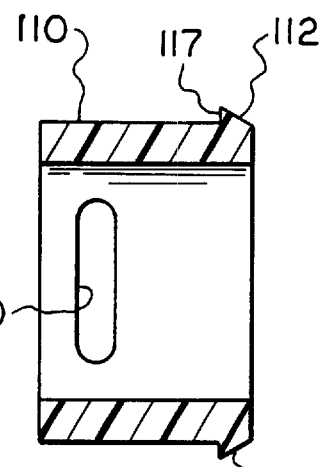
FIG. 20 is a cross sectional view taken substantially along line 20—20 of FIG. 19.
Figure 21:
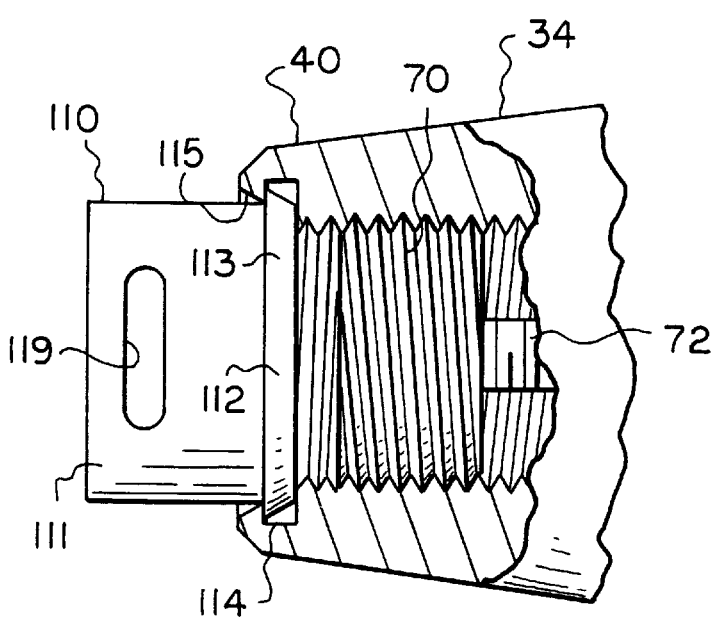
FIG. 21 is a fragmentary view, partially in cross section showing the key guide installed in the front portion of the lock housing.

In FIGS. 19, 20 and 21 a ring-lock key guide 110 is shown which fits into the front portion 40 of lock housing 34. More specifically, the key guide 110 includes a hollow cylindrical body 111 having an annular collar 112 thereon which has a tapered upper surface 113. Collar 112 is received in annular groove 114 of front portion 40 of lock housing 34. In this respect, the tapered surface 113 of collar 112 slides along the inclined surface 115 of housing portion 40, and when collar 112 reaches groove 114, it snaps into place with the rear annular edge 117 of collar 112 bearing against the wall, not numbered, of groove 114, to thereby retain collar 112 in groove 114.

The ring-lock key guide 110 is fabricated of flexible plastic material which permits the collar 112 to distort during the installation process, and it thereafter snaps back into its annular shape to retain the ring-lock key guide 110 in position.

Figure 18:
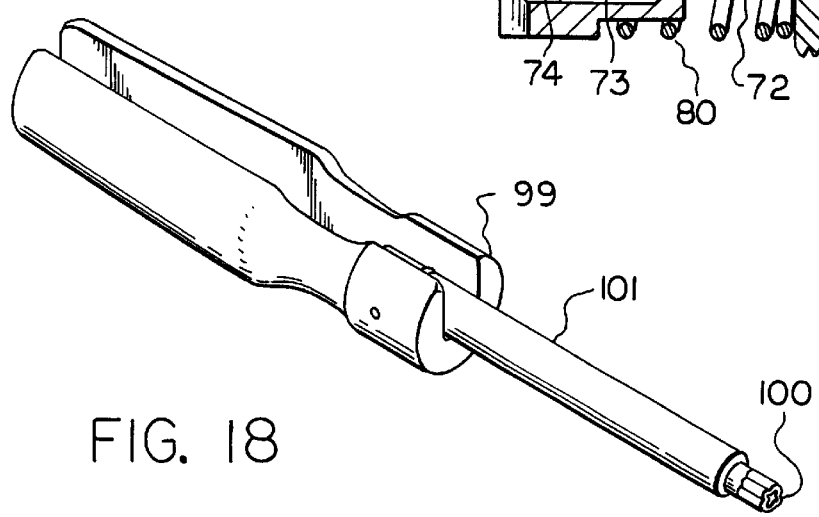
FIG. 18 is a perspective view of the key used to unlock the ring-type meter lock.

The ring-lock key guide performs a plurality of functions. In this respect, it acts as a guide for the stem 101 of key 99 (FIG. 18). Also, it prevents the plug 70 from falling out when it is unscrewed. Additionally, there are two diametrically opposed slots 119 and 120 in cylindrical body 111 which can be used to receive the wires of a seal of the type having the wire thereof extending through slots 119 and 120 with the ends of the wires fastened in a seal member, so that the portion of the wire extending across the opening prevents an effective tool from being passed through the ring-lock key guide 110 without the wire breaking. Also, if desired the wire can also extend through opening 64 in tongue portion 62 and slot 97 in front plate 47, as discussed above.

While preferred embodiments of the present invention have been disclosed, it will be appreciated that it is not limited thereto but may be otherwise embodied within the scope of the following claims.

SEQUENCE LISTING

Not applicable

What is claimed is:

1. A ring-type meter lock comprising a ring, first and second ends on said ring, a lock housing on said first end, a first slot in said lock housing, a spring-biased latch unit in said lock housing, a latch on said spring-biased latch unit enterable and withdrawable from said first slot, a tongue on said second end enterable into said first slot, at least one second slot in said tongue receiving said latch, and a key-receiving configuration in said latch unit.

2. A ring-type meter lock as set forth in claim 1 wherein said lock housing includes a bore, and wherein said spring-biased latch unit is positioned in said bore.

3. A ring-type meter lock as set forth in claim 2 including a threaded portion in said bore, and wherein said spring-biased latch unit includes first and second ends, a threaded plug on said first end threaded into said threaded portion of said bore, said latch being mounted on said second end, a stem connecting said threaded plug and said latch, a spring positioned between said threaded plug and said latch, and a slidable connection between said stem and said latch.

4. A ring-type meter lock as set forth in claim 3 wherein said key-receiving configuration is in said threaded plug.

5. A ring-type meter lock as set forth in claim 3 wherein said latch is positioned in a noncircular portion of said bore.

6. A ring-type meter lock as set forth in claim 1 wherein said ring section is resilient, and wherein said tongue is enterable into said first slot against the resilience of said ring section.

7. A ring-type meter lock as set forth in claim 6 wherein said lock housing includes a bore, and wherein said spring-biased latch unit is positioned in said bore.

8. A ring-type meter lock as set forth in claim 7 including a threaded portion in said bore, and wherein said spring-biased latch unit includes first and second ends, a threaded plug on said first end threaded into said threaded portion of said bore, said latch being mounted on said second end, a stem connecting said threaded plug and said latch, a spring positioned between said threaded plug and said latch, and a slidable connection between said stem and said latch.

9. A ring-type meter lock as set forth in claim 8 wherein said key-receiving configuration is in said threaded plug.

10. A ring-type meter lock as set forth in claim 8 wherein said latch is positioned in a noncircular portion of said bore.

11. ring-type meter lock as set forth in claim 1 wherein said latch has two spaced teeth, and wherein said tongue has two spaced second slots for receiving said two spaced teeth.

12. A ring-type meter lock comprising a ring, first and second ends on said ring, a lock housing on said first end, a first slot in said lock housing, a latch unit in said lock housing, a latch on said latch unit enterable and withdrawable from said slot, a tongue on said second end enterable into said first slot, at least one second slot in said tongue receiving said latch, and a key-receiving configuration in said latch unit.

13. A ring-type meter lock as set forth in claim 12 wherein said lock housing includes a bore, and wherein said latch unit is positioned in said bore.

14. A ring-type meter lock as set forth in claim 13 including a threaded portion in said bore, and wherein said latch unit includes first and second ends, a threaded plug on said first end threaded into said threaded portion of said bore, and said latch being mounted on said second end.

15. A ring-type meter lock as set forth in claim 14 wherein said key-receiving configuration is in said threaded plug.

16. A ring-type meter lock as set forth in claim 14 wherein said latch is positioned in a noncircular portion of said bore.

17. A ring-type meter lock as set forth in claim 12 wherein said ring section is resilient, and wherein said tongue is enterable into said first slot against the resilience of said ring section.

18. A ring-type meter lock as set forth in claim 17 wherein said lock housing includes a bore, and wherein said latch unit is positioned in said bore.

19. A ring-type meter lock as set forth in claim 18 including a threaded portion in said bore, and wherein said latch unit includes first and second ends, a threaded plug on said first end threaded into said threaded portion of said bore, and said latch being mounted on said second end.

20. A ring-type meter lock as set forth in claim 19 wherein said key-receiving configuration is in said threaded plug.

21. A ring-type meter lock as set forth in claim 19 wherein said latch is positioned in a noncircular portion of said bore.

22. A ring-type meter lock as set forth in claim 12 wherein said latch has two spaced teeth, and wherein said tongue has two spaced second slots for receiving said two spaced teeth.

23. A ring-type meter lock as set forth in claim 12 wherein said lock housing includes a bore, and wherein said latch unit is positioned in said bore, and a ring-lock key guide mounted in said bore and having a portion extending outwardly from said lock housing.

24. A ring-type of meter lock comprising a ring, first and second ends on said ring, a lock housing secured to said first end, a bore in said lock housing, a spring-biased latch unit in said bore, said latch unit including a plug in said bore, a latch head, a stem connecting said latch head to said plug, and a spring between said latch head and said plug.

25. A ring-type of meter lock as set forth in claim 24 including a slot in said lock housing proximate said latch head.

26. A ring-type of meter lock as set forth in claim 24 wherein said plug is threaded into said bore.

27. A ring-type of meter lock as set forth in claim 26 wherein said bore includes a noncircular portion, and wherein said latch head is in said noncircular portion.

28. A ring-type of meter lock as set forth in claim 25 wherein said bore includes a noncircular portion, and wherein said latch head is in said noncircular portion.

29. A ring-type of meter lock as set forth in claim 24 wherein said stem is slidably received in said latch head.

30. A ring-type of meter lock as set forth in claim 29 including a slot in said lock housing proximate said latch head.

31. A ring-type of meter lock as set forth in claim 29 wherein said plug is threaded into said bore.

32. A ring-type of meter lock as set forth in claim 31 wherein said bore includes a noncircular portion, and wherein said latch head is in said noncircular portion.

\* \* \* \* \*

UNITED STATES PATENT AND TRADEMARK OFFICE
CERTIFICATE OF CORRECTION

PATENT NO. : 6,439,010 B1  Page 1 of 1
DATED : August 27, 2002
INVENTOR(S) : Bradley J. Julicher It is certified that error appears in the above-identified patent and that said Letters Patent is hereby corrected as shown below:

Column 6,
Line 8, before "ring-type" insert -- A --.

Signed and Sealed this

Nineteenth Day of November, 2002

Attest:

Attesting Officer

JAMES E. ROGAN
Director of the United States Patent and Trademark Office